Nov. 15, 1960 C. H. ZIERDT, JR 2,960,418
SEMICONDUCTOR DEVICE AND METHOD FOR FABRICATING SAME
Filed June 29, 1954
FIG. 1.
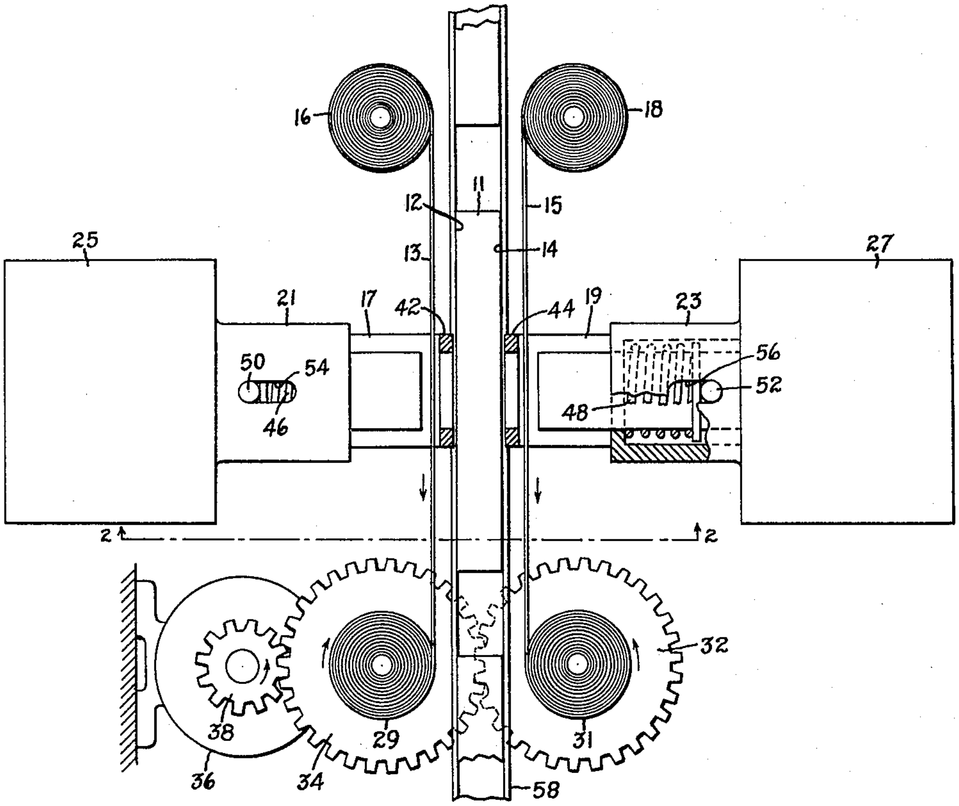
FIG. 3. FIG. 4. FIG. 5.
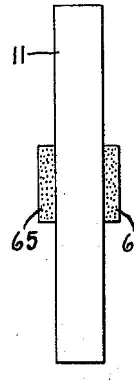
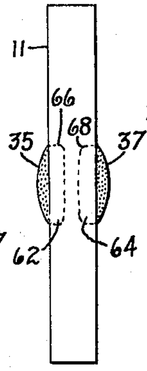
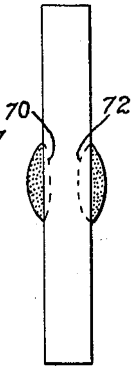
FIG. 2.
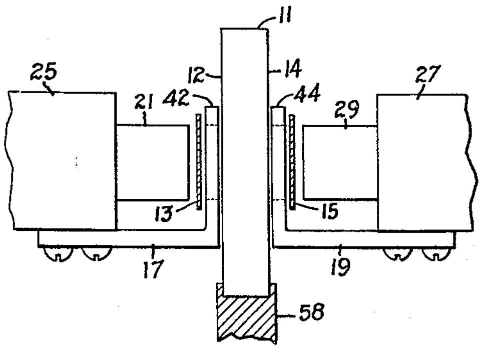
INVENTOR:
CONRAD H. ZIERDT, JR.
BY Julius J. Zaskalicky
HIS ATTORNEY.

United States Patent Office 2,960,418
Patented Nov. 15, 1960

2,960,418

SEMICONDUCTOR DEVICE AND METHOD FOR FABRICATING SAME

Conrad H. Zierdt, Jr., Syracuse, N.Y., assignor to General Electric Company, a corporation of New York Filed June 29, 1954, Ser. No. 440,091

5 Claims. (Cl. 148—1.5)

This invention relates generally to junction semiconductor devices, and more particularly, to an improved device and method for making the same.

As is well known, semiconductor devices usually comprise at least two zones of opposite-type semiconductor material that are contiguous and form a P–N junction. Among the methods for producing such devices is an alloying method disclosed in a copending application of W. C. Dunlap, Jr., Serial No. 187,490, now abandoned, filed September 29, 1950. The present invention provides an improved method for fabricating the devices disclosed therein.

As disclosed in the Dunlap application, diffused junction devices are constructed by alloying and diffusing an activator material, sometimes termed an impurity material, into a wafer of semiconductor material. As is well known, semiconductor materials containing an excess of electrons are N-type semiconductors. Semiconductor material containing an excess of holes, that is, having a deficiency of electrons, are P-type semiconductors. If the wafer of semiconductor material is P-type, then the activator material must be a donor activator to create a P–N junction in the wafer. Examples of donor activator materials are antimony and arsenic. Conversely, if the wafer of semiconductor material is N-type, then an acceptor activator material, such as indium, aluminum or gallium must be diffused into the wafer to form a P–N junction therein.

Previously, semiconductor devices of the diffused junction type, as disclosed in the Dunlap application, have been assembled by placing the impurity on a horizontally positioned wafer of semiconductor material and holding the assembly in the horizontal position while the wafer is heated sufficiently to cause diffusion of the impurity in the wafer to form a P–N junction. In the manufacture of a transistor triode, in which impurities are alloyed into both sides of a wafer of semiconductor material, in accordance with previous disclosures, two steps are necessary. First, impurity material is placed on one side of a wafer and the wafer is heated to attach the material thereto. Subsequently, the wafer is turned over and impurity material is placed on the opposite face of the wafer and attached thereto by heating. Such a method of dual positioning of the impurities on a transistor triode is slow and not adapted to mass production as it requires two heatings, as well as two separate positioning operations.

Accordingly, it is a principal object of the present invention to provide a method for simultaneously attaching both impurity dots to a semiconductor wafer at one time.

Further, devices fabricated in accordance with prior disclosures produce junctions that are not planar but instead are more nearly spherical. At high frequencies, spherical junctions have a reduced effective area because of the large distance between junctions at the edges. This reduced area causes a decided drop in the amplification at high frequencies which is undesirable.

Accordingly, another object of the present invention is to provide an improved P–N junction device.

A further object of the present invention is to provide an improved method for fabricating semiconductor devices having planar junctions.

In carrying out one form of the invention, a portion of activator material is mechanically pressed against a semiconductor wafer to cause strong adherence thereto with resultant ease of handling thereof, and thereafter the semiconductor wafer is treated to uniformly diffuse the activator material into the wafer.

The features of this invention which are believed to be novel are set forth with particularity in the appended claims. The invention itself, however, both as to its organization and method of operation, together with further objects and advantages thereof, may best be understood by reference to the following description when taken in conjunction with the accompanying drawing wherein:

Fig. 1 is a diagrammatic plan view of assembling apparatus and of a semiconductor wafer in position for assembly therein;

Fig. 2 is a view taken along line 2—2 in Fig. 1;

Fig. 3 depicts a semiconductor device before heating but after the attachment of the impurity dots;

Fig. 4 shows a device fabricated in accordance with the present invention, and

Fig. 5 shows a device fabricated in accordance with the teachings of the prior art.

Referring now to Figs. 1 and 2, an illustrative means for practicing the present invention is there shown. A semiconductor wafer 11 having opposed parallel faces 12 and 14 is shown in position to attach activator material thereto. Ribbons 13 and 15 of activator material are positioned adjacent the sides 12 and 14, respectively. Reels 16 and 18 provide a continuing supply of activator material. Driving reels 29 and 31 are provided to unwind the ribbons 13 and 15 from the reels 16 and 18. The reel 31 is driven by gear 32, which in turn is driven by a gear 34 mounted coaxially with reel 29. A motor 36 drives the gear 34 through an intermediate gear 38. Guide means, here shown as die bushings 42 and 44 are positioned between the wafer 11 and the ribbons 13 and 15, respectively. The die bushings 42 and 44 form, in conjunction with the punches 17 and 19, a cutting tool for severing a segment of the activator ribbons 13 and 15, respectively. Preferably, the bushings 42 and 44 are constructed of a material which is strong but which does not contaminate the semiconductor wafer 11. Further, it is preferable that the bushings 42 and 44 be constructed of a material which does not require lubrication because most lubricants would contaminate the wafer 11. An example of a material having the desired properties is nylon.

The punches 17 and 19 are held in a normally retracted position by springs 46 and 48, respectively. Motive means 25 and 27 are provided for moving the punches 17 and 19 from the normally retracted position through the die bushings 42 and 44 to cut segments of activator material from the ribbons 13 and 15. The motive means 25 and 27 may comprise any of a variety of hand-operated or automatic means.

The travel of the punches 17 and 19 is adjusted so that the cut segments of activator ribbons are pressed against the faces 12 and 14 of the wafer 11. It is necessary that the travel be adjusted so that sufficient pressure is exerted on the indium to cause the cut indium segments to adhere to the opposed faces of the wafer 11. Limit pins 50 and 52 travel in slots 54 and 56, respectively. The forward travel of the punches 17 and 19 is halted when the limit pins contact the ends of the slots 54 and 56.

The wafers 11 of semiconductor material are constituted of any desired material, such as germanium or silicon, of the desired type, either N-type or P-type. The ribbons of activator material 13 and 15 are of the type necessary to produce P–N junctions when diffused into the body of the wafer. For example, the wafer 11 may be N-type germanium and the ribbons 13 and 15 may be indium or a lead alloy containing an acceptor material. If it is desired to produce only a single P–N junction in the wafer 11, only one ribbon and one punch are used.

To fabricate a diffused junction transistor in accordance with the present invention, a wafer 11 is moved into position between the punches 12 and 19 by a carriage 58 (Fig. 2). The punches 17 and 19 are simultaneously reciprocated by the cylinders 21 and 23 to cut generally circular segments from the ribbons. As mentioned above, the travel of the punches 17 and 19 is such that the circular segments from the activator ribbons are pressed against the wafer 11. The force exerted by the punches 17 and 19 is sufficient to cause adhesion of the circular segments to the wafer 11. In one embodiment cited for purposes of illustration, a 5 mil wafer and a pair of 15 mil ribbons of indium were utilized. The punches were moved until they were separated by 10 mils. The wafer 11 is shown in Fig. 3 with the circular segments 65 and 67 mechanically pressed onto the wafer so as to adhere thereto. It should be noted that circular segments or dots are accurately positioned and can be moved in any position.

Subsequently, the wafer 11 is place in an oven and heated, to cause alloying and diffusing of the activator material into the wafer 11, thereby forming the desired P–N junctions thereon. Fig. 4 shows the completed semiconductor device with two circular segments 35 and 37 fused to the wafer 11. A portion of the activator material is diffused into the wafer 11 to form zones 62 and 64 of opposite conductivity type from the wafer and separated therefrom by junctions 66 and 68. As shown, the body of the wafer 11 is N-type semiconductor material and the diffused regions are P-type, thus forming a P–N–P junction transistor. As shown in Fig. 4, the junction regions 66 and 68 obtained by the present method are substantially parallel to the faces of the wafer 11 and to each other, as desired for good performance. In Fig. 5 is shown a junction device made by prior art techniques without initially adhering the activator into the wafer in accordance with the present invention. Note that the junction regions 70 and 72 are not parallel, with the result that poor performance is obtained.

Parallel junctions are desirable because the high frequency response is substantially improved as mentioned above. The junctions attain the configuration shown in Fig. 4 because the activator material alloys into the wafer before the liquid activator material is forced into a spherical shape by the high surface tension of the activator material. The adhesive force is greater than the surface tension forces, and hence, when heated, the material alloys into the wafer substantially parallel to the face of the wafer.

It will be understood that the use of the invention is not limited to the embodiments herein displayed; that many variations of geometry of the semiconductor device may be accomplished by the technique of the invention, including parallel, concentric, and other forms as well as the opposed form shown.

Further, while the present invention has been described by reference to particular embodiments thereof, it will be understood that numerous modifications may be made by those skilled in the art without actually departing from the true spirit and scope of the invention.

What I claim as new and desire to secure by Letters Patent of the United States is:

1. A method of fabricating semiconductor devices which compises placing a wafer of crystalline germanium of N-type conductivity adjacent a segment of indium, pressing said segment of indium against said wafer of germanium with a force sufficient to cause adhesion therebetween, said adhesion between said wafer and indium being greater than the cohesion of said indium, and heating said wafer to diffuse a portion of said indium into said wafer to form a P–N junction therein.

2. A method of fabricating semiconductor devices which comprises placing a wafer of crystalline germanium having parallel faces between two segments of indium, pressing said segments of indium against said parallel faces of said wafer of germanium with a force sufficient to cause adhesion between said wafer and said indium, transporting said wafer and said adhered indium to a heat source, and heating said wafer to diffuse a portion of said indium into said germanium to form P–N junctions within said wafer.

3. The method of fabricating a semiconductor device which comprises placing a wafer of crystalline germanium semiconductor material adjacent a segment of activator material containing indium, pressing said segment of activator material against said wafer of semiconductor material with a force sufficient to cause said segment to adhere to said wafer, said adhesive force being greater than the cohesive force of said indium, and heating said wafer to cause a portion of said activator material to diffuse into said wafer.

4. The method of fabricating a semiconductor device which comprises placing a wafer of crystalline germanium semiconductor material of one type adjacent a segment of activator material containing indium and of a type to form a P–N junction in said wafer, pressing said segment of activator material against said wafer of semiconductor material with a force sufficient to cause said segment to adhere to said wafer, said adhesive force being greater than the cohesive force of said activator and heating said wafer to cause a portion of said activator material to enter said wafer to form a P–N junction therein.

5. The method of fabricating a semiconductor device which comprises placing a quantity of activator material adjacent a wafer of crystalline semiconductive material, pressing said activator material against said wafer of semiconductor material, and heating said semiconductive material to cause penetration of said activator into said semiconductor material, said activator material being applied to said semiconductor material with a force such that an adhesive force between said activator and said semiconductor wafer is greater than the cohesive force within said activator material, whereby a uniform penetration of said activator into said semiconductor material is obtained when said semiconductor material is heated.

References Cited in the file of this patent

UNITED STATES PATENTS

| | | |
|---|---|---|
| 2,561,411 | Pfann | July 24, 1951 |
| 2,603,693 | Kircher | July 15, 1952 |
| 2,697,052 | Dacey | Dec. 14, 1954 |
| 2,701,326 | Pfann | Feb. 1, 1955 |
| 2,791,524 | Ozarow | May 7, 1957 |

OTHER REFERENCES

Hughes: Metals and Plastics, published by Irwin Farnham Publishing Co., Chicago, 1947, pages 263 and 264.

Journal of Applied Physics, vol. 24, 1953, page 224.